United States Patent [19]

Wright et al.

[11] Patent Number: 4,835,111

[45] Date of Patent: May 30, 1989

[54] METHOD OF FABRICATING SELF-ALIGNED ZENER DIODE

[75] Inventors: James R. Wright, San Jose; Philip Shiota, Saratoga, both of Calif.

[73] Assignee: Teledyne Industries, Inc., Mountain View, Calif.

[21] Appl. No.: 125,015

[22] Filed: Nov. 24, 1987

Related U.S. Application Data

[63] Continuation-in-part of Ser. No. 11,104, Feb. 5, 1987, abandoned.

[51] Int. Cl.$^4$ ............................................. H01L 29/90
[52] U.S. Cl. ..................................... 437/20; 437/162; 437/904; 357/13
[58] Field of Search ............... 437/160, 161, 162, 904, 437/20, 25; 357/13

[56] References Cited

U.S. PATENT DOCUMENTS

| 4,119,440 | 10/1978 | Hile | 357/13 |
| 4,155,777 | 5/1979 | Dunkley et al. | 357/13 |
| 4,164,436 | 8/1979 | Ura et al. | 357/13 |
| 4,473,941 | 10/1984 | Turi et al. | 437/904 |
| 4,616,404 | 10/1986 | Wang et al. | 437/904 |

Primary Examiner—Olik Chaudhuri
Attorney, Agent, or Firm—Fliesler, Dubb, Meyer & Lovejoy

[57] ABSTRACT

A method of fabricating a self-aligned zener diode provides for N+ and P+ regions having the large dopant concentrations necessary for compatibility with shallow junction silicon gate CMOS devices. A contact region is provided on the substrate, doped with N-type dopant ions, and etched to cover a portion of the region in which a zener diode is to be formed. A P+ region is implanted using the doped contact region as a mask. Then, N-type dopant ions are diffused from the contact region to the underlying substrate, thereby providing self-aligned P+ and N+ regions having a well defined P-N junction.

14 Claims, 3 Drawing Sheets

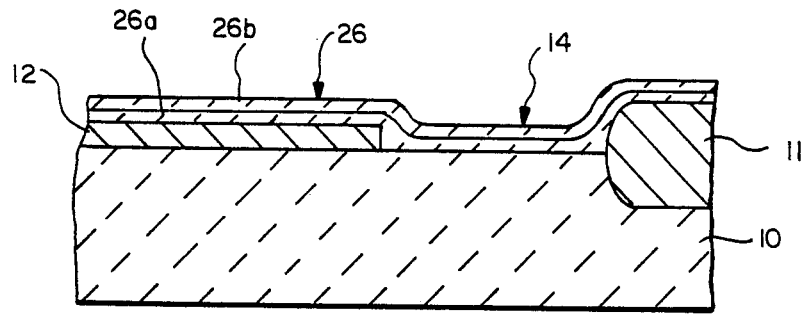
FIG. —4
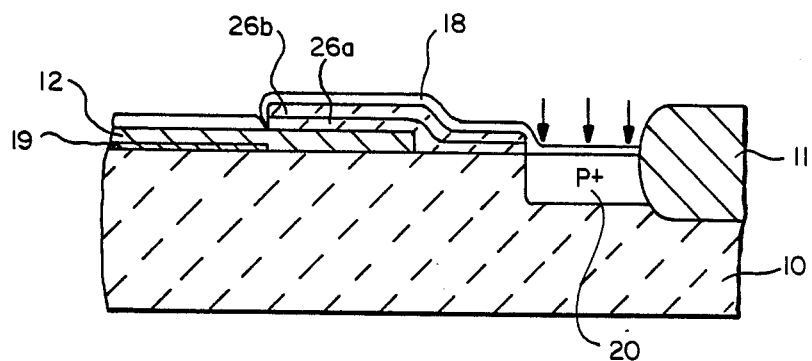
FIG. —5
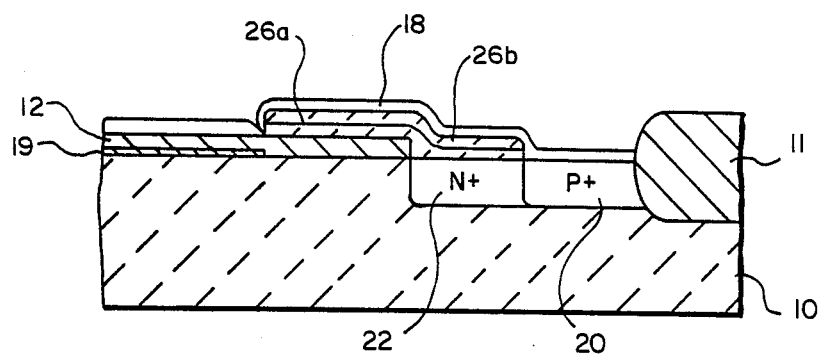
FIG. —6

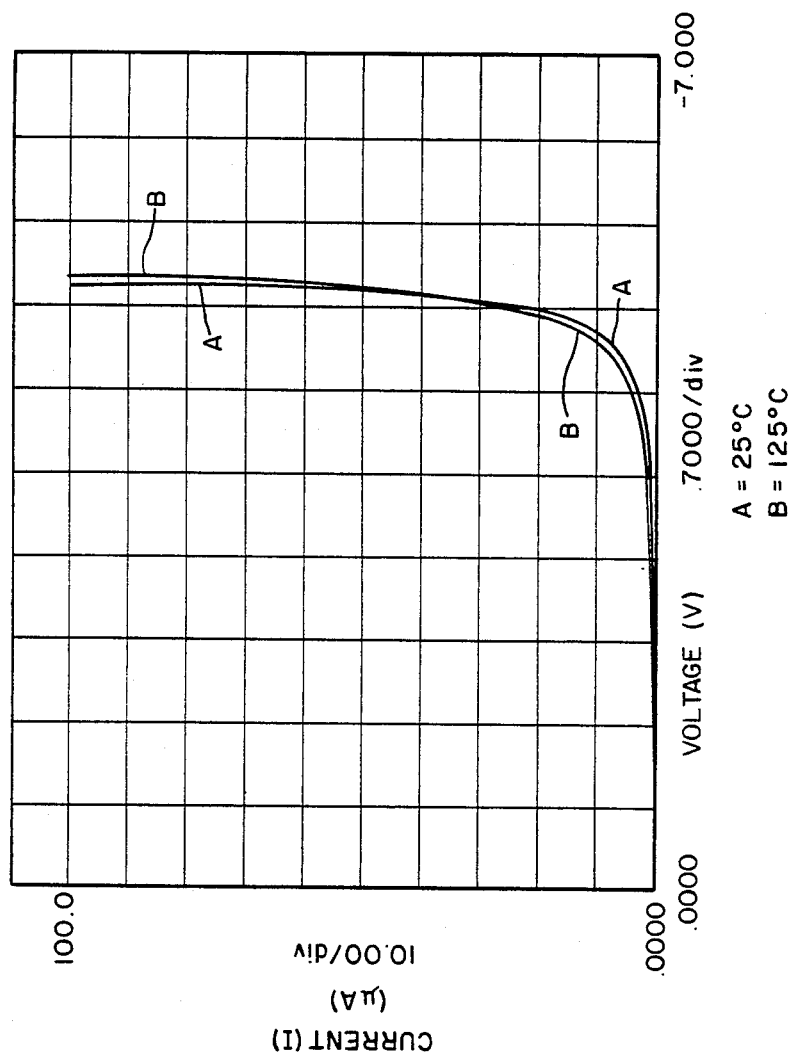
FIG.—7

METHOD OF FABRICATING SELF-ALIGNED ZENER DIODE

RELATED APPLICATION

This application is a continuation-in-part of application Ser. No. 011,104, filed Feb. 5, 1987, now abandoned.

BACKGROUND OF INVENTION

1. Field of the Invention

The present invention relates to zener diodes and a method of fabricating zener diodes; more particularly, to the fabrication of zener diodes compatible with CMOS technology.

2. Description of the Related Art

Zener diodes are an important part of analog, linear integrated circuits. The performance of zener diodes is determined, in large part, by the junction between the N and P regions which form the diode.

Conventional methods of fabricating zener diodes involve compensation or counter-doping. A P+ region is provided and then partially masked. N-type dopant ions are implanted in the exposed, i.e., unmasked, portion of the P+ region to counter-dope the region, thereby providing the N+ region of the zener diode. This so-called compensation method is satisfactory with CMOS devices having relatively deep junctions, for example, a junction depth of approximately 2 microns. With deep junctions the desired resistivity of the N+ region, i.e., 15–20 Ω/square, can be achieved with a doping level on the order of $2-3 \times 10^{20}$ atoms/cm$^3$. However, on a relative basis a large amount of doping is required to counter-dope a P+ region to provide it with N+ type conductivity characterization.

The current trend is to reduce junction depths in CMOS devices to less than 1 micron to provide better transistor characteristics. Reducing the junction depth requires an increased doping level to achieve the same resistivity of the N+ region because the same number of dopant ions must be provided in a smaller volume of material. For example, reducing the junction depth from 2.1 microns to 0.7 microns requires a tripling of the doping level from approximately $2-3 \times 10^{20}$ atom/cm$^3$ to approximately $6-9 \times 10^{20}$ atoms/cm$^3$. Zener diodes fabricated by the compensation method with such high doping levels exhibit erratic electrical characteristics. Such zener diodes have a breakdown voltage which was not reproducible and in some cases is as small as 'volt. A 1 volt breakdown voltage is less than standard biasing voltages, and renders the device useless as a zener diode.

SUMMARY OF THE INVENTION

It is, therefore, an object of the present invention to provide a method of fabricating a zener diode which is compatible with both CMOS and bipolar semiconductor device fabricating techniques.

Another object of the present invention is to provide a method of fabricating a self-aligned zener diode compatible with shallow junction CMOS devices.

A further object of the present invention is to provide a method of fabricating a zener diode which produces satisfactory zener diodes when high dosage concentrations are used in the N+ and P+ regions of the zener diode.

A further object of the present invention is to provide a method of fabricating a zener diode which requires less counter-doping (or compensation) than conventional methods of fabricating zener diodes.

A further object of the present invention is to provide a method of fabricating a zener diode in which the material used to mask the active region during the doping of the P+ region is also used to dope the N+ region, thus providing a self-aligned zener diode, and in which the material used to mask the N+ region forms the electrical contact with the N+ region.

A further object of the present invention is to provide a method of fabricating a self-aligned zener diode which has improved operating characteristics and a low temperature coefficient.

In accordance with the method of the present invention, the fabrication of a self-aligned zener diode includes the steps of forming an oxide layer on a semiconductor substrate, etching a portion of the oxide layer to expose a portion of the substrate, forming a contact region of, for example, polysilicon, on the oxide layer and the exposed portion of the substrate, doping the contact region with dopant ions corresponding to a first conductivity type, removing the contact region from a selected portion of the exposed region of the substrate, doping the portion of the substrate from which the contact region has been removed with dopant ions corresponding to a second conductivity type, and doping the portion of the substrate underlying the contact region by diffusing the dopant ions corresponding to the first conductivity type from the contact region to the substrate. The doped contact region in contact with the first conductivity type portion of the zener diode is used as the electrical contact to the first conductivity type portion of the zener diode.

In another embodiment of the method of the present invention, the contact region comprises multiple layers, for example, a polysilicon layer and a silicide layer deposited on a polysilicon layer after the polysilicon layer is doped.

Zener diodes fabricated in accordable with the method of the present invention are compatible with CMOS devices having shallow junction depths, e.g., silicon gate CMOS devices. In particular, by self-aligning the P+ and N+ regions zener diodes can be formed in which the concentration of dopant ions in the P+ and N+ regions exceeds $5 \times 10^{20}$ atoms/cm$^3$. A further advantage of the method of the present invention is that zener diodes having low temperature coefficients and which are extremely stable may be produced. A still further advantage of the method of the present invention is that it is easily integrated into standard processes for fabricating CMOS and bipolar semiconductor devices.

BRIEF DESCRIPTION OF THE DRAWINGS

FIGS. 4–6 are cross-sectional views showing various steps in the fabrication of a self-aligned zener diode in accordance with a second embodiment of the present invention.

FIG. 7 is a graph for explaining the temperature coefficient of a zener diode fabricated in accordance with the present invention.

DESCRIPTION OF THE PREFERRED EMBODIMENTS

Figure 1:
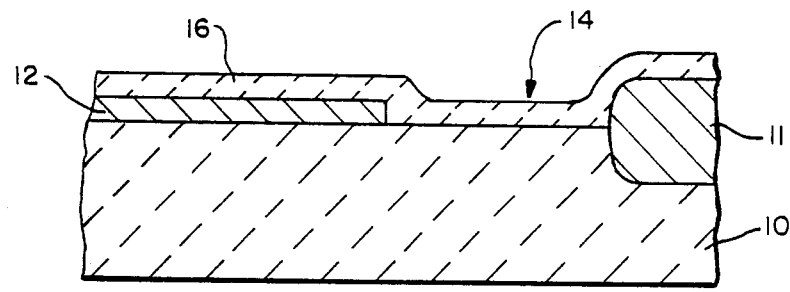
FIGS. 1–3 are cross sectional views showing various steps in the fabrication of a self-aligned zener diode in accordance with a first embodiment of the present invention.

A method of fabricating a self-aligned zener diode in accordance with a first embodiment of the present invention will be described with reference to FIGS. 1–3. As shown in FIG. 1, a semiconductor substrate 10 is provided with a field oxide region 11, and an oxide layer 12 provided on the surface of the substrate 10. The oxide layer 12 is etched to expose an active region 14 in the surface of the substrate 10 where a zener diode is to be formed. Then, a contact region, for example, polysilicon layer 16, is deposited on the oxide layer 12 and on the active region 14 of the substrate 10. The contact region may be formed of other materials which forms electrical contacts and conductors and which, as discussed below, can be used to dope a portion of the active region 14. Polysilicon layer 16 is doped with N-type dopant ions by, for example, implanting phosphorus ions using standard ion implantation techniques.

Figure 2:
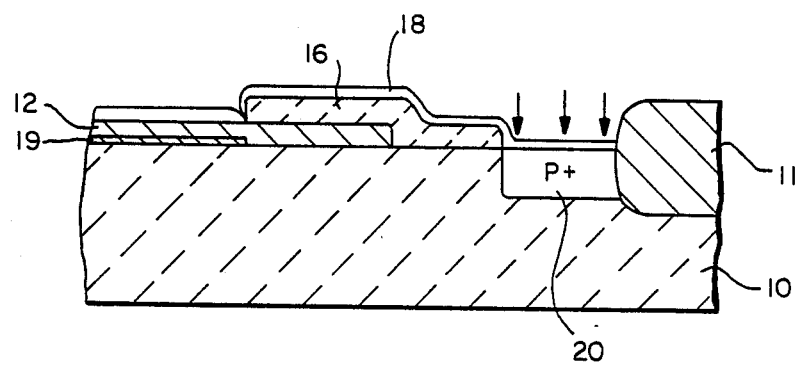

With reference to FIG. 2, polysilicon layer 16 is masked and etched. The remaining polysilicon layer 16 covers only a portion of the active region 14. An oxide layer 18 is grown on the surface of the exposed portion of the active region 14 and on the polysilicon layer 16. The oxide layer 18 grows to a greater thickness on the doped polysilicon layer 16 than on the undoped substrate 0 since the growth rate of an oxide increases with the doping of the material on which the oxide is grown. An oxide layer 19 is also grown at the interface of oxide layer 12 and substrate 10 during the process of growing oxide layer 18. Alternatively, an oxide layer (not shown) can be formed on polysilicon layer 16 prior to etching polysilicon layer 16 to expose the active region 14. In this case the oxide layer (not shown) will only exist on polysilicon layer 16.

Then, the exposed portion of the active region 14 is doped with P-type dopant ions, for example, boron, by, for example, ion implantation. Doping the exposed portion of the active region with P-type ions provides a P+ region 20 in the substrate 10. Oxide layer 18 masks polysilicon layer 16 and the unexposed portion of active region 14 during the doping of P+ region 20. The dopant concentration in the P+ region 20, in the range of $1-9 \times 10^{20}$ atoms/cm$^3$, should be sufficient to provide a resistivity of approximately 20–75 $\Omega$/square.

Figure 3:
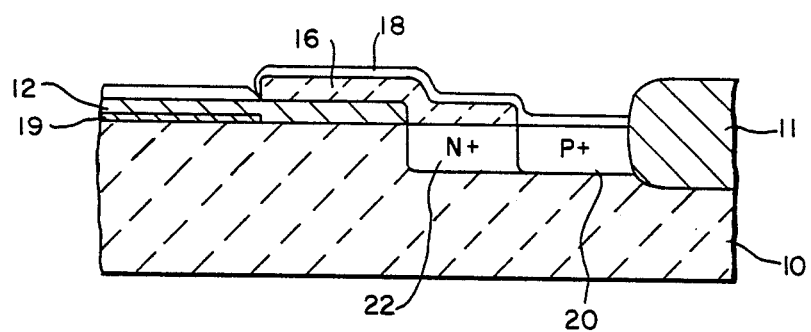

With reference to FIG. 3, the N-type dopant ions in polysilicon layer 16 are diffused into the active region 14 from polysilicon layer 16 to form an N+ region 22 having a self-aligned junction with P+ region 20. The N-type ions may be diffused from the polysilicon layer 16 to the substrate 10 by, for example, annealing. Again, the dopant concentration in N+ region 22, e.g., $1-9 \times 10^{20}$ atoms/cm$^3$, should be sufficient to provide a resistivity of approximately 15–20 $\Omega$/square. Because oxide layer 18 and polysilicon layer 16 mask the unexposed portion of the active region 14 during the doping of P+ region 20, the formation of N+ region 22 does not require counter-doping or compensation. Further, the annealing causes a slight lateral diffusion of the N-type dopant ions into the P+ region 20, and prevents the polysilicon layer 16 from contacting P+ region 20. This enables polysilicon layer 16 to be utilized as the electrical contact for N$^{30}$ region 22.

Those of ordinary skill in the art will appreciate that the implants used to dope the polysilicon layer 16 and the P+ region 20 will also be used to form the source and drain regions in the P and N channel transistors of a concurrently fabricated CMOS devices.

A method of fabricating a self-aligned zener diode in accordance with a second embodiment of the present invention will be described with reference to FIGS. 4–6. As shown in FIG. 4, and as in the first embodiment, a semiconductor substrate 10 is provided with a field oxide region 11, and an oxide layer 12 is provided on the surface of the substrate 10. Oxide layer 12 is then etched to expose an active region 14 in the surface of the substrate 10 where a zener diode is to be formed. Then, a multilayer contact region is formed.

The multilayer contact region 26 includes a first layer or layers which can be utilized to dope a portion of the active region 14 and a second layer or layers which when provided on the first layer or layers, improve the electrical conductivity of the contact region 26. For example, a two layer contact region 26 may be provided as follows. First, a first layer 26a of polysilicon is deposited on oxide layer 12 and on the active region 14 of the substrate 10 and doped with N-type dopant ions. Then a second layer 26b of a material which is more conductive than the doped polysilicon or which in combination with the doped polysilicon layer 26a provides better conductivity than polysilicon layer 26a, for example silicide layer 26b, is formed on doped polysilicon layer 26a.

The remaining processing steps are similar to those discussed with respect to the first embodiment. Briefly, as shown in FIG. 5, the contact region 26, including polysilicon layer 26a and silicide layer 26b, is masked and etched so that the remaining portion of the contact region 26 covers only a portion of the active region 14. An oxide layer 18 may be provided on the surface of the exposed portion of the active region 14 and on the contact region 26a, 26b. The exposed portion of active region 14 is doped with P-type dopant ions to provide a P+ region 20 in substrate 10. In the second embodiment of the invention, the first layer 26a of the contact region is protected by the second layer 26b, and thus oxide layer 18 is not necessary to protect first layer 26a during the ion implantation of the exposed portion of the active region 14.

Then, with reference to FIG. 6, the N-type dopant ions in first layer 26a are diffused into the active region 14 to form an N+ region 22 having a self-aligned junction with P+ region 20. As in the first embodiment, the N-type ions may be diffused from first layer 26a to the substrate 10 by, for example, annealing. The annealing causes a slight lateral diffusion of the N-type dopant ions into P+ region 20, and thus prevents electrical shorting of the first and second content layers 26a, 26b with P+ region 20.

The low temperature coefficient of a self-aligned zener diode fabricated in accordance with the method of the present invention is illustrated by FIG. 7. In FIG. 7 curve A is a current versus voltage plot at 25° C. and curve B is a current versus voltage plot at 125° C. The small change in the electrical characteristics of the zener diode over a 100° C. temperature range clearly indicates a low temperature coefficient.

The present invention may be embodied in other specific forms without departing from the spirit and essential characteristics thereof. The disclosed embodiments are therefore to be considered to be illustrative and not restrictive, the scope of the invention being indicated by the claims, rather than the foregoing description.

I claim:
1. A method of fabricating a self-aligned zener diode, comprising the steps of:
   (a) providing a semiconductor substrate having an active region;
   (b) providing a contact region including dopant ions corresponding to a first conductivity type on a first portion of the active region;
   (c) doping a second portion of the active region, laterally adjacent to the first portion of the active region, with dopant ions corresponding to a second conductivity type, using the contact region as a mask; and
   (d) diffusing dopant ions from the contact region to the first portion of the first portion of the active region to dope the first portion of the active region.

2. A method of fabricating a self-aligned zener diode according to claim 1, wherein said step (b) comprises providing a polysilicon layer on the first portion of the active region and doping the polysilicon layer with dopant ions corresponding to the first conductivity type.

3. A method of fabricating a self-aligned zener diode according to claim 1, wherein said step (d) comprises annealing the zener diode.

4. A method of fabricating a noncompensated, self-aligned zener diode in a semiconductor substrate, comprising the steps of:
   (a) forming a polysilicon layer on the substrate;
   (b) doping the polysilicon layer with dopant ions corresponding to a first conductivity type;
   (c) removing the polysilicon layer from a first portion of the substrate;
   (d) doping the first portion of the substrate with dopant ions corresponding to a second conductivity type using the polysilicon layer as a mask; and
   (e) diffusing dopant ions from the polysilicon layer to the substrate to dope a second portion of the substrate, adjacent to the first portion of the substrate and underlying the polysilicon layer, with dopant ions corresponding to the first conductivity type.

5. A method of fabricating a zener diode according to claim 4, wherein said step (e) comprises annealing the zener diode.

6. A method of fabricating a zener diode according to claim 4, wherein:
   said step (b) comprises doping the polysilicon layer with N-type conductivity dopant ions; and
   said step (d) comprises doping the first portion of the substrate with P-type conductivity dopant ions.

7. A method of fabricating a zener diode according to claim 6, wherein:
   said step (d) comprises providing the first portion of the substrate with P+-type conductivity characteristics; and
   said step (e) comprises providing the second portion of the substrate with N+-type conductivity characteristics.

8. A method of fabricating a noncompensated self-aligned zener diode in a semiconductor substrate, comprising the steps of:
   (a) providing a first oxide layer on the substrate;
   (b) removing a portion of the first oxide layer to expose an active region of the substrate;
   (c) providing a polysilicon layer on the active region of the substrate;
   (d) doping the polysilicon layer with dopant ions corresponding to a first conductivity type;
   (e) removing the polysilicon layer from a first portion of the active region;
   (f) providing a second oxide layer on the polysilicon layer;
   (g) doping the first portion of the active region with dopant ions corresponding to a second conductivity type using the second oxide layer to mask the polysilicon layer and a second portion of the active region; and
   (h) annealing the zener diode to diffuse first conductivity type dopant ions from the polysilicon layer to the second portion of the active region.

9. A method of fabricating a noncompensated, self-aligned zener diode according to claim 8, wherein said method comprises providing the polysilicon layer as an electrical contact to the second portion of the active region.

10. A method of fabricating a non-compensated self-aligned zener diode in a semiconductor substrate, comprising the steps of:
    (a) forming a polysilicon layer on the substrate;
    (b) doping said polysilicon layer with dopant ions corresponding to a first conductivity type;
    (c) providing a contact layer on said polysilicon layer, said contact layer having a lower resistivity than said polysilicon layer;
    (d) removing the polysilicon and second contact layers from a first portion of the substrate;
    (e) doping the first portion of the substrate with dopant ions corresponding to a second conductivity type using the polysilicon and contact layers as a mask; and
    (f) diffusing dopant ions from said polysilicon layer to dope a second portion of the substrate, adjacent to the first portion of the substrate, with dopant ions corresponding to the first conductivity type.

11. A method of fabricating a zener diode according to claim 10, wherein said step (f) comprises annealing the zener diode.

12. A method of fabricating a zener diode according to claim 10, wherein said step (c) comprises providing a silicide layer on the polysilicon layer.

13. A method of fabricating a non-compensated, self-aligned zener diode in a semiconductor substrate, comprising the steps of:
    (a) providing a first oxide layer on the substrate;
    (b) removing a portion of the first oxide layer to expose an active region of the substrate;
    (c) providing a polysilicon layer on the active region of the substrate;
    (d) doping the polysilicon layer with dopant ions corresponding to a first conductivity type;
    (e) providing a silicide layer on the polysilicon layer;
    (f) removing the polysilicon and silicide layers from a first portion of the active region;
    (g) doping the first portion of the active region with dopant ions corresponding to a second conductivity type using the silicide layer to mask the polysilicon layer and a second portion of the active region; and
    (h) annealing the zener diode to diffuse first conductivity type dopant ions from the polysilicon layer to the second portion of the active region.

14. A method of fabricating a non-compensated, self-aligned zener diode according to claim 13, wherein said method comprises providing the polysilicon layer and the silicide layer as an electrical contact to the second portion of the active region.

* * * * *